US009893734B1

(12) United States Patent
Chillara et al.

(10) Patent No.: US 9,893,734 B1
(45) Date of Patent: Feb. 13, 2018

(54) ADJUSTING PHASE OF A DIGITAL PHASE-LOCKED LOOP

(71) Applicant: Analog Devices Global, Hamilton (BM)

(72) Inventors: Vamshi Krishna Chillara, Limerick (IE); Declan M. Dalton, Ballyneety (IE)

(73) Assignee: Analog Devices Global, Hamilton (BM)

( * ) Notice: Subject to any disclaimer, the term of this patent is extended or adjusted under 35 U.S.C. 154(b) by 0 days.

(21) Appl. No.: 15/284,195

(22) Filed: Oct. 3, 2016

(51) Int. Cl.
*H03L 7/07* (2006.01)
*H03L 7/099* (2006.01)
*H03L 7/091* (2006.01)

(52) U.S. Cl.
CPC ............... *H03L 7/07* (2013.01); *H03L 7/091* (2013.01); *H03L 7/0994* (2013.01)

(58) Field of Classification Search
CPC .......... H03L 7/07; H03L 7/091; H03L 7/0994
USPC ................................ 327/147, 150, 156, 157
See application file for complete search history.

(56) References Cited

U.S. PATENT DOCUMENTS

| | | | |
|---|---|---|---|
| 6,556,086 B2 | 4/2003 | Keaveney et al. | |
| 7,317,360 B2 | 1/2008 | Keaveney | |
| 7,463,710 B2 | 12/2008 | Walsh et al. | |
| 8,570,082 B1* | 10/2013 | Kuo | H03L 1/00 327/158 |
| 2013/0343173 A1* | 12/2013 | Ahmadi Mehr | H04B 1/0483 370/215 |
| 2014/0085012 A1 | 3/2014 | Wu et al. | |
| 2017/0012631 A1 | 1/2017 | Dato et al. | |

OTHER PUBLICATIONS

Temporiti, et al., "A 3 GHz Fractional All-Digital PLL With a 1.8 MHz Bandwidth Implementing Spur Reduction Techniques," IEEE Journal of Solid-State Circuits, vol. 44, No. 3, Mar. 2009, pp. 824-834.
Wu, et al., "A mm-Wave FMCW Radar Transmitter Based on a Multirate ADPLL," 2013 IEEE Radio Frequency Integrated Circuits Symposium, Jun. 2013, pp. 107-110.
Wu, Wanghua, "Millimeter-Wave Digitally-Assisted Frequency Synthesizer in CMOS," Doctoral Thesis, Delft University of Technology, 2013.

* cited by examiner

*Primary Examiner* — John Poos
(74) *Attorney, Agent, or Firm* — Knobbe, Martens, Olson & Bear, LLP

(57) ABSTRACT

Aspects of this disclosure relate to a digital phase-locked loop (DPLL) arranged to adjust output phase using a phase adjustment signal. In certain embodiments, the phase adjustment signal can be received in a signal path from an output of a time-to-digital converter of the DPLL to an input to the digitally controlled oscillator of the DPLL. Some embodiments relate to adjusting the output phase of the DPLL to reduce a relative phase difference between the output phase of the DPLL and an output phase of another DPLL.

22 Claims, 9 Drawing Sheets

ADJUSTING PHASE OF A DIGITAL PHASE-LOCKED LOOP

FIELD OF DISCLOSURE

The disclosed technology relates to digital phase-locked loops, and more particularly, to adjusting a phase of a digital phase-locked loop.

BACKGROUND

Clock signals are used to synchronize the flow of data signals among synchronous signal paths. In some applications, clock signals control the command signals sent to interconnected digital blocks within a system. Such applications may include a clock distribution system providing a variety of clock frequencies with high precision, low noise, and predictable phase alignment.

Phase-locked loops (PLLs) can be implemented in a clock distribution system. A PLL is a closed loop system for locking the phase of a reference clock with an oscillator. A PLL can be designed to be of a specific type (e.g., type-I, type-II, or higher) with a specific order (e.g., $1^{st}$ order, $2^{nd}$ order, or higher). In system theory, the type can refer to the number of integrators within the loop and the order can refer to the degree of the denominator in the PLL system transfer function. In some applications, a clock distribution system can use a single clock source as an input and generate multiple clock outputs with a frequency that is different compared to the single clock source.

SUMMARY OF THE DISCLOSURE

The innovations described in the claims each have several aspects, no single one of which is solely responsible for the desirable attributes. Without limiting the scope of the claims, some prominent features of this disclosure will now be briefly described.

One aspect of this disclosure is a frequency synthesis system comprises a first digital phase-locked loop and a second digital phase-locked loop. The first digital phase-locked loop is configured to provide a first clock signal. The second digital phase-locked loop is configured to provide a second clock signal, to receive a phase adjustment signal, and to adjust a phase of the second clock signal. The second clock signal has substantially the same frequency as the first clock signal. The phase of the second clock signal is adjusted based on the phase adjustment signal so as to cause a relative phase difference between the first clock signal and the second clock signal to be reduced.

The frequency synthesis system can further comprise a combining circuit configured to generate an output clock signal based on the first clock signal and the second clock signal.

The second digital phase locked loop can comprise a digitally controlled oscillator and a time-to-digital converter. The phase adjustment signal can be applied in a signal path from an output of the time to digital converter to an input to the digitally controlled oscillator.

The second digital phase locked loop can comprise a digital loop filter configured to receive a signal that is based on an output of a phase detector of the second digital phase-locked loop and the phase adjustment signal.

The frequency synthesis system can further comprise a phase adjustment circuit configured to generate the phase adjustment signal based on an indication of the relative phase difference between the first clock signal and the second clock signal.

The frequency synthesis system can further comprise a phase adjustment circuit configured to generate an indication of the relative phase difference between the first clock signal and the second clock signal based on a first signal from a feedback path of the first digital phase-locked loop and a second signal from a feedback path of the second digital phase locked loop.

The frequency synthesis system can further comprise a phase adjustment circuit configured to generate an indication of the relative phase difference between the first clock signal and the second clock signal based on an output of a first accumulator associated with the first digital phase-locked loop and an output of a second accumulator associated with the second digital phase-locked loop. The first accumulator and the second accumulator can be configured to reset at different times.

The first digital phase-locked loop can be configured to receive a second phase adjustment signal and to adjust a phase of the first clock signal.

The first clock signal and the second clock signal can have phases that are within 10° of each other.

Another aspect of this disclosure is a phase-locked loop comprises a digitally controlled oscillator and a time-to-digital converter. The digitally controlled oscillator is configured to generate a clock signal. The phase-locked loop is configured to receive a phase adjustment signal in a signal path from an output of the time-to-digital converter to an input to the digitally controlled oscillator. Also, a phase of the clock signal is based on the phase adjustment signal.

The phase-locked loop can further comprise a digital loop filter coupled in the signal path from the output of the time-to-digital converter to the input to the digitally controlled oscillator. The digital loop filter can be configured to receive a signal that is based on an output of a phase detector of the phase-locked loop and the phase adjustment signal.

The phase-locked loop can further comprise a phase detector, a summer, and a digital loop filter. The summer can be configured to receive an output of the phase detector and the phase adjustment signal. The digital loop filter can be configured to receive an output of the summer.

The phase-locked loop can further comprise a summer and a phase detector. The summer can be configured to receive a frequency command word and the phase adjustment signal. The phase detector can be configured to receive an output of the summer.

The phase-locked loop can have a phase which is adjustable over a range of 360°. Also, the phase adjustment signal can be a digital word.

Another aspect of this disclosure is a method of synchronizing clock signals provided by digital phase-locked loops comprises detecting a relative phase difference between a first clock signal provided by a first digital phase-locked loop and a second clock signal provided by a second digital phase-locked loop, and responsive to detecting the relative phase difference, adjusting a phase of the first clock signal. The phase of the first clock signal is adjusted to cause the relative phase difference to be reduced. The first clock signal and the second clock signal have substantially the same frequency.

Adjusting the phase of the first clock signal can comprise applying a phase adjustment signal to a signal path between an output of a time-to-digital converter and an input of a digitally controller oscillator in the first digital phase-locked loop.

Detecting the relative phase difference can comprise comparing an output of a first accumulator associated with the first digital phase-locked loop with an output of a second accumulator associated with the second digital phase-locked loop. The first accumulator and the second accumulator can be configured to reset at different times.

The method can further comprise adjusting a phase of the second clock signal responsive to said detecting. Also, the method can further comprise generating an output clock signal based on the first clock signal and the second clock signal.

For purposes of summarizing the disclosure, certain aspects, advantages and novel features of the innovations have been described herein. It is to be understood that not necessarily all such advantages may be achieved in accordance with any particular embodiment. Thus, the innovations may be embodied or carried out in a manner that achieves or optimizes one advantage or group of advantages as taught herein without necessarily achieving other advantages as may be taught or suggested herein.

BRIEF DESCRIPTION OF THE DRAWINGS

These drawings and the associated description herein are provided to illustrate specific embodiments and are not intended to be limiting.

DETAILED DESCRIPTION

Figure 1A:
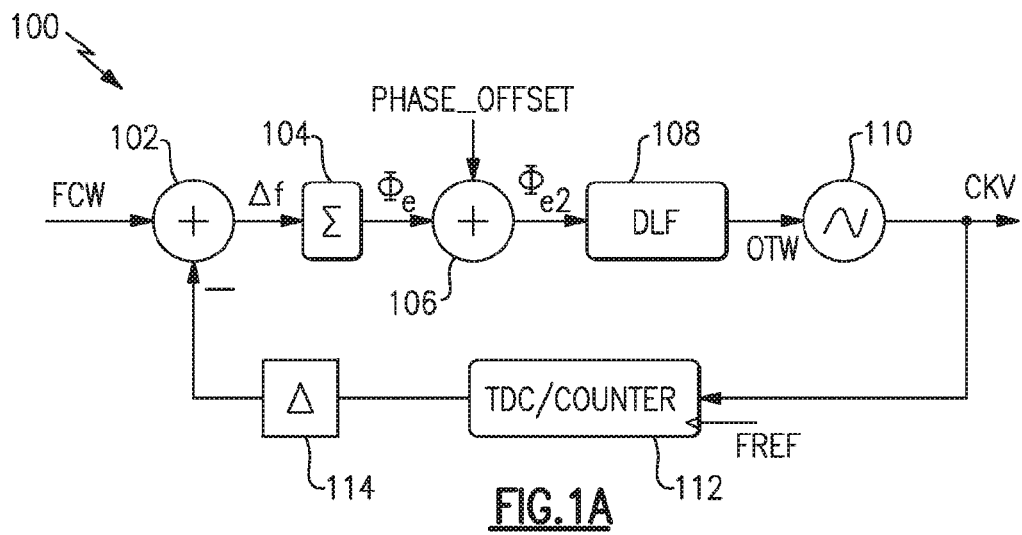
FIG. 1A is a schematic block diagram of a digital phase-locked loop (DPLL) with phase offset control according to an embodiment.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

When lock is achieved in a fractional-N phase-locked loop (PLL), a reference clock signal can be synchronized to a frequency-divided output of the PLL's oscillator. Accordingly, the oscillator can provide a frequency that is greater than the frequency of the reference clock signal by a factor of proportionality referred to as the division ratio N. In a fractional-N PLL, a sigma-delta modulator or accumulator can be used to periodically change the division ratio so that N takes on an average non-integral value.

After a phase-locked loop is locked, a phase of an output clock signal can be non-zero. Although, in a locked PLL the output clock and the input reference clock signal acquire the same frequency, there can be a phase difference when the output clock lags or leads the input reference clock signal. Controlling phase can be a significant aspect of reducing interference in clocking systems and/or RF systems. Accordingly, there is a desire to control the phase between an output clock and an input reference clock signal provided to a phase-locked loop.

A digital phase-locked loop (DPLL) can be an attractive alternative to traditional analog charge-pump phase-locked loops (CP-PLLs) for frequency synthesis, for example, in advanced complementary metal oxide semiconductor (CMOS) technologies. While CP-PLLs are still widely used, DPLLs offer advantages more easily realized in the digital domain. These advantages can include enhanced performance and/or speed. DPLLs can be implemented with a reduction in size and/or cost relative to CP-PLLs. A CP-PLL typically includes a voltage-controlled oscillator, which can be sensitive to temperature and to power supply variations, while a DPLL can be designed to be substantially immune to its environment and power supply. Accordingly, a DPLL, such as a fractional-N DPLL, in the digital domain can be desirable in certain applications. Advantageously, a fractional-N digital PLL (DPLL) in accordance with embodiments discussed herein can solve problems of synchronizing pulses while also controlling the phase of the output clock.

Apparatus and methods for adjusting and/or synchronizing output phase in digital phase-locked loops (DPLLs) are discussed herein. A method to digitally program the output phase of the DPLL is described. A synchronization technique to phase align multiple output clocks of different DPLLs with the same input reference clock signal is also described. By injecting a phase control signal into a path of the DPLL, the phase of an output of a digitally controlled oscillator (DCO) clock can be programmed. The phase control signal can be a digital signal or word. The phase control signal can correspond to phase angle in degrees. For instance, the DPLLs can be divider-less or phase-domain architectures.

The phase of an output clock, also referred to herein as output phase, can be programmed to a value with an accuracy that can be bounded by phase noise of a PLL. Phase can be mathematically bounded to a phase branch defined for a complete cycle. For instance, phase can be limited between 0 and 360 degrees (deg), or alternatively, between −180 deg and 180 deg.

The teachings herein present approaches for addressing accuracy in synchronizing multiple DPLL output clocks that are clocked by the same reference clock signal. One approach uses information or derived signals from time-to-digital converters (TDCs) of two or more DPLLs to generate a correction term. A second approach uses an integrated (accumulated) value of the fractional part of the frequency command word, which can achieve an order of magnitude or greater improvement in accuracy relative to the first approach in certain instances. Compared to the first approach, the second approach can achieve significantly improved accuracy at the expense of an additional accumulator in some instances.

FIG. 1A is a schematic block diagram of a digital phase-locked loop (DPLL) 100 with phase offset control according to an embodiment. The DPLL 100 includes a first summer 102, an accumulator 104, a second summer 106, a digital loop filter (DLF) 108, a digitally controlled oscillator (DCO) 110, a time-to-digital converter (TDC)/counter 112, and a differencing block 114. A frequency command word FCW is provided as digital data at an input of the first summer 102. The frequency command word FCW provides digital data that the DPLL 100 uses to generate an output clock signal CKV having an output frequency. The DPLL 100 can be a DPLL of any type (e.g. type-I, type-II, or higher) and/or of any order (e.g. first order, second order, or higher).

As shown in FIG. 1A, the output clock signal CKV is provided by the DCO 110. The DCO 110 receives an oscillator tuning word OTW from the DLF 108. The output clock signal CKV is provided to the TDC/counter 112.

The TDC/counter 112 converts the output phase to a decimal number normalized to the clock period of the DCO 110. The output normalized phase can then be differentiated in the digital domain by the differencing block 114 to generate the digitized output frequency for a phase detector. In the digital domain, a z-transform representation of the differencing block 114 can be represented by the transform $(1-z^{-1})$ in certain applications.

The TDC/counter 112 and the differencing block 114 together convert the output clock signal CKV to a digital signal that is provided to the first summer 102. The summer 102 can be clocked by the reference clock signal FREF or a signal derived from the reference clock signal FREF. The output of the differencing block 114 is a digital word that is subtracted from the frequency command word FCW by the first summer 102. The first summer 102 and the accumulator 104 together operate as a phase detector.

As shown in FIG. 1A the TDC/counter 112 receives a reference clock signal FREF. The reference clock signal FREF can be used for setting the reference clock signal frequency of the DPLL and to provide a clocking signal for the TDC/counter 112. The frequency of the output clock signal of the DPLL 100 can be determined by the product of the frequency command word FCW and the frequency of the reference clock signal FREF.

In the teachings herein, the phase of the output clock signal CKV can be determined by comparing a rising and/or a falling edge of the output clock signal CKV with a transition edge (rising or falling) of the reference clock signal FREF. As described in the following figures, information from the TDC/counter 112 can be correlated with the phase of the output clock signal CKV and with respect to the reference clock signal FREF.

The first summer 102 and the accumulator 104 can operate as a phase detector so as to provide a DPLL phase error $\Phi_e$. The first summer 102 can compare the difference of the frequency command word FCW with the output of the differencing block 114 to provide a frequency error $\Delta f$. As illustrated, the frequency error $\Delta f$ is a digital signal that is integrated in the digital domain by the accumulator 104 so as to provide the DPLL phase error $\Phi_e$. In a DPLL, such as the DPLL 100, when the frequency of the output clock signal CKV becomes locked to the frequency command word FCW, the DPLL has acquired lock. When lock is acquired, the frequency error $\Delta f$ reduces to zero or to almost zero.

The DPLL phase error $\Phi_e$ can be related to the phase error between the input reference clock signal and the output clock signal CKV.

The phase, or phase difference between the input reference clock signal and the output clock signal CKV, can take on any value over a complete cycle ranging between 0 degrees and 360 degrees. As discussed above, this range of values can be shifted mathematically to any range having a total of 360 degrees.

The teachings herein related to an apparatus and method for adjusting the output phase when the reference frequency and the frequency of the output clock signal CKV are in lock. In the teachings herein, "output phase" may refer to the phase of the output clock signal CKV. The phase may be measured with respect to a clock edge (e.g., a rising edge or a falling edge). The output phase can be relative to a phase of the reference clock signal. By including the second summer 106 between the accumulator 104 and the DLF 108, the output phase can be adjusted when phase adjustment signal Phase_offset is added to the DPLL phase error $\Phi_e$. The phase adjustment signal Phase_offset and the phase error $\Phi_e$ can be used to adjust the phase of the output clock signal CKV in accordance with any suitable mathematical operation (e.g., addition, subtraction, etc.).

As shown in FIG. 1A, the accumulator 104 provides the DPLL phase error $\Phi_e$ to the second summer 106. The second summer 106 can add the phase adjustment signal Phase_offset in the digital domain to the DPLL phase error $\Phi_e$ to effect a change in the output phase and to thereby provide an adjusted DPLL phase error an adjusted DPLL phase error $\Phi_{e2}$. The second summer 106 provides the adjusted DPLL phase error $\Phi_{e2}$ to the DLF 108. The DLF 108 then provides an oscillator tuning word OTW to the DCO 110.

A fixed frequency reference can be set by programming the frequency command word FCW. Accordingly, when the DPLL 100 acquires lock to a fixed frequency reference, then the DPLL phase error $\Phi_e$ can be digital word which has a steady-state value. Also, depending, at least in part, on the DPLL type and order, the phase error $\Phi_e$ can be constant. The DPLL phase error $\Phi_e$ can fluctuate due to noise, and in some configurations the average value of the DPLL phase error $\Phi_e$ can be zero when the DPLL 100 acquires lock. Thus, the output of the accumulator 104 can fluctuate around zero when the DPLL has acquired lock.

When a constant offset is introduced (e.g., added) via the second summer 106, the DPLL 100 adjusts its output phase to ensure the DPLL phase error $\Phi_e$ reaches its steady state locked value. As described above the DPLL can be configured such that the DPLL phase error $\Phi_e$ is zero. As shown in FIG. 1A, the phase adjustment signal Phase_offset is added to the DPLL phase error $\Phi_e$ via the second summer 106. When the phase adjustment signal Phase_offset is a positive constant or a digital word representation of a positive constant, then the loop overestimates the reference phase. In response, the output phase increases by an amount which can be proportional to, approximately equal to, or equal to the positive constant. Similarly, when phase adjustment signal Phase_offset is a negative constant or digital word, the output phase decreases. This is further illustrated in FIG. 2.

Figure 1B:
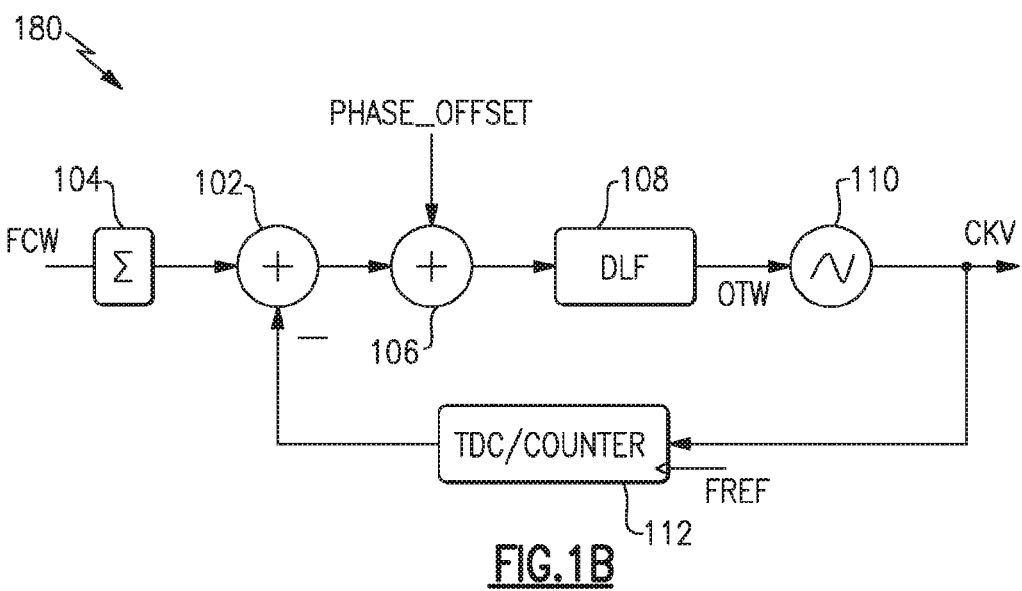
FIG. 1B is a schematic block diagram of a DPLL with phase offset control according to another embodiment.

FIG. 1B is a schematic block diagram of a DPLL 180 with phase offset control according to an embodiment. The DPLL 180 is similar to the DPLL 100 of FIG. 1A except that the first summer 102 and the accumulator 104 are arranged in a different order and the differencing block 114 is excluded. In the DPLL 180, the accumulator 104 received the frequency command word FCW and provides an output to the first summer 102. Like the DPLL 100 of FIG. 1A, the DPLL 180 also includes the second summer 106, the DLF 108, the DCO 110, and the TDC/counter 112. The frequency command word FCW is provided as digital data at an input of the accumulator 104. The frequency command word FCW provides digital data that the DPLL 180 uses to generate an output clock signal CKV having an output frequency. The DPLL 180 can also be a DPLL of any type (e.g. type-I, type-II, or higher) and/or of any order (e.g. first order, second order, or higher).

In the DPLL 180, the TDC/counter 112 converts the output clock signal CKV to a digital signal that is provided to the first summer 102 and is subtracted from the accumulated (integrated) frequency command word FCW by the first summer 102. The first summer 102 and the accumulator 104 together operate as a phase detector in the DPLL 180.

Figure 2:
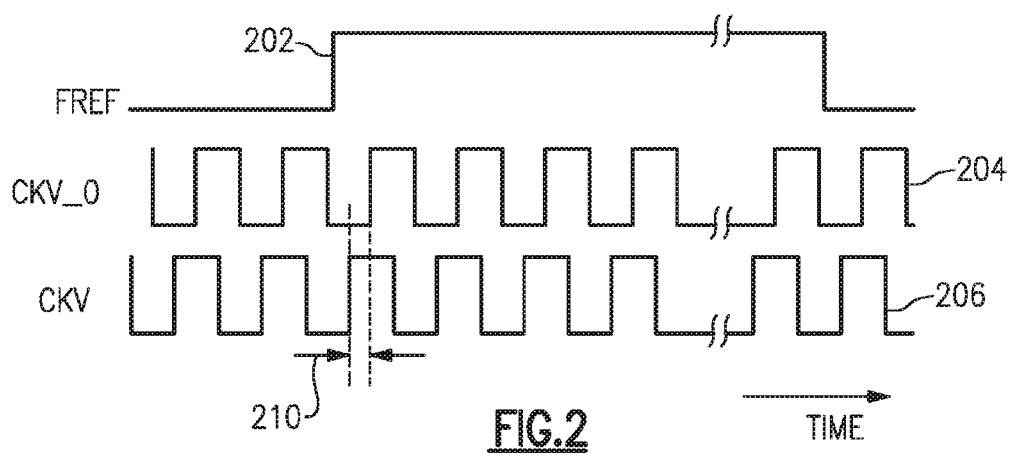
FIG. 2 compares waveforms of an output of a digitally controlled oscillator with and without an offset in a DPLL according to an embodiment.

FIG. 2 compares waveforms for different values of the phase adjustment signal in a DPLL according to an embodiment. The DPLL can correspond to the DPLL 100 of FIG. 1A or the DPLL 180 of FIG. 1B. FIG. 2 shows the reference clock signal FREF waveform 202, a first output clock signal waveform 204, and as second output clock signal waveform 206. The first output clock signal waveform 204 can correspond to a configuration where the value of the phase adjustment signal Phase_offset is set to 0. Accordingly, the output clock signal CKV is labelled "CKV_0." The second output clock signal waveform 206 can correspond to a configuration where the value of the phase adjustment signal Phase_offset is set to a positive constant value, which can be represented by a digital word. Responsive to the phase adjustment signal Phase_offset changing from 0 to a positive value, a phase adjustment can occur to cause the output clock signal provided by the DCO of the DPLL to change from first output clock signal waveform 204 to the second output clock signal waveform 206. The shaded region delineated on the second output clock signal waveform 206 shows there is a relative output phase shift 210 when the phase adjustment signal Phase_offset is applied to a DPLL.

In general, when a positive offset is added, the loop overestimates the reference phase, thereby increasing the output phase by this offset. Similarly, when a negative offset is added (or a positive offset is subtracted), the output phase decreases by that amount. The output phase can be programmed by a full 360 degrees. For instance, the output phase can be programmed from −180 degrees to 180 degrees or from 0 degrees to 360 degrees. The accuracy of programming the phase can be bounded by the phase error of the DPLL, which can be a relatively small number amount such as 0.3 degrees. Thus, the phase of a DPLL can programmed to within about 0.3 degrees of accuracy in such a DPLL. According to some other embodiments, the phase can be programmed such within 5° of accuracy. In certain embodiments, the phase can be programmed to within 1° of accuracy such that a clock signals can have a phase that is within 1° of another clock signal having the same frequency.

Figure 3:
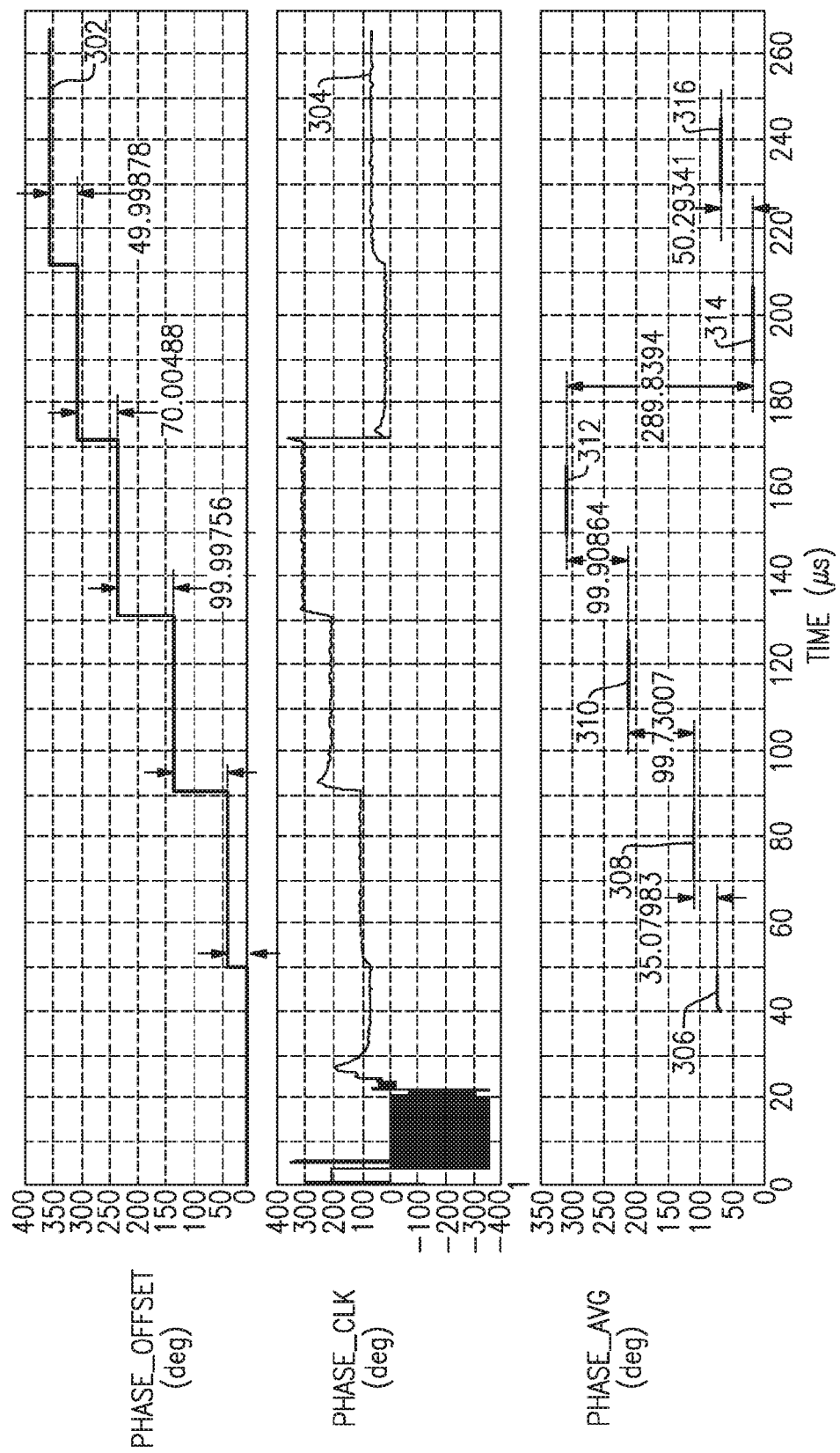
FIG. 3 shows simulation plots illustrating the programmability of output phase of a DPLL according to an embodiment.

FIG. 3 shows simulation plots illustrating the programmability of output phase of a DPLL according to an embodiment. The DPLL can correspond to the DPLL 100 of FIG. 1A or the DPLL 180 of FIG. 1B where the phase adjustment signal Phase_offset is programmed to different values. FIG. 3 illustrates the phase adjustment signal Phase_offset by a first waveform 302 and the output phase Phase_clk by a second waveform 304. An average output phase Phase_avg as a function of time is shown in a third graph including a first average 306, a second average 308, a third average 310, a fourth average 312, a fifth average 314, and a sixth average 316. Each waveform, including that of the phase adjustment signal Phase_offset, has units of degrees (deg).

The simulation plots of FIG. 3 illustrate phase programmability within the DPLL 100. As shown in FIG. 3, the phase adjustment signal phase_offset can be programmed to have different values; in response to the different values, the output phase Phase_clk and the average output phase Phase_avg vary by a predictable amount. Between time equal to 0 microseconds (us) and 270 us, the phase adjustment signal Phase_offset is incrementally stepped starting from a phase of 0 degrees to a maximum of 360 degrees.

The programmed phase steps occur at times equal to approximately 50 us, 90 us, 130 us, 170 us, and 210 us. The amount of each step in degrees is delineated on the first waveform 302. For instance, from 0 to 50 microseconds (us), the phase adjustment signal Phase_offset is 0. During this time period, the DPLL 100 acquires lock, and the output phase Phase_clk settles to approximately 70 degrees. At time equal to approximately 50 us, the phase adjustment signal Phase_offset is stepped by 35.00244 degrees. In response, the output phase Phase_clk increases by about the same amount, and the average output phase Phase_avg increases by 35.07983 degrees from the first average 306 to the second average 308. Similarly, at time equal to approximately 90 us, the phase adjustment signal Phase_offset is incrementally stepped by 99.99756 degrees. In response, the output phase Phase_clk increases by about the same amount, and the average output phase Phase_avg increases by 99.73007 degrees from the second average 308 to the third average 310.

At time equal to approximately 170 us there is phase wrap-around in the output phase Phase_clk and in the average output phase Phase_avg. Phase wrap-around occurs due to the phase being defined to be contained within the range of 0 and 360 deg. Phase wrapping into the range 0 to 360 degrees can be accomplished, for instance, by subtracting 360 degrees from any value of phase that exceeds 360 degrees. Thus, at time equal to approximately 170 us, when the phase adjustment signal Phase_offset is stepped by 70.00488 degrees, there is a corresponding phase-wrapping in both the output phase Phase_clk and the average output phase Phase_avg.

Figure 4:
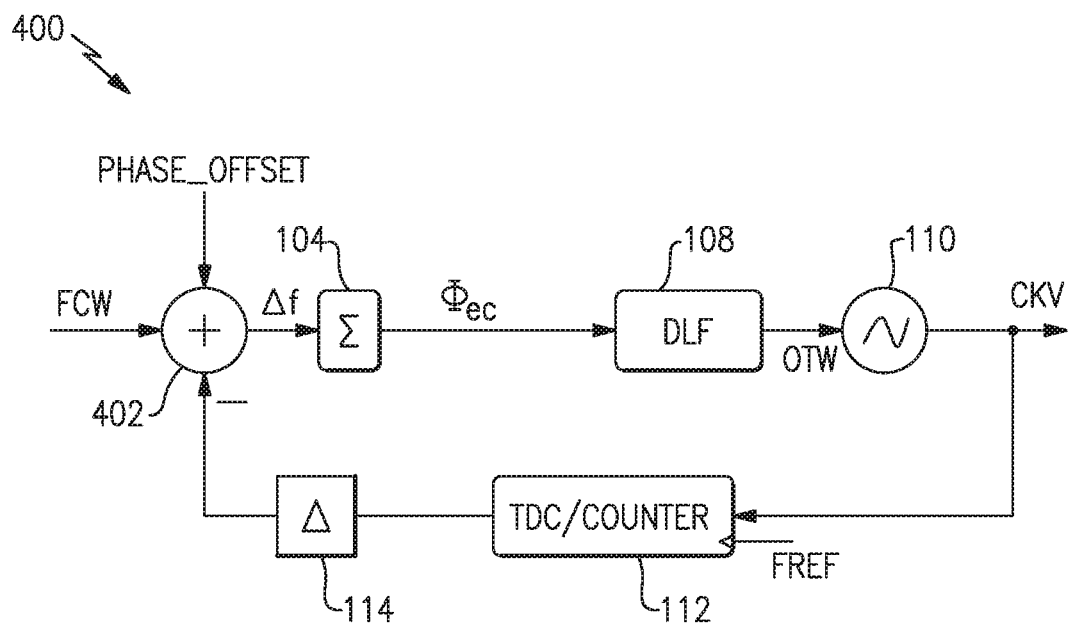
FIG. 4 is a schematic block diagram of a DPLL with phase offset control according to another embodiment.

FIG. 4 is a schematic block diagram of a DPLL 400 with phase offset control according to another embodiment. The DPLL 400 of FIG. 4 is similar to the DPLL 100 of FIG. 1A except the phase adjustment signal Phase_offset is applied at a different part of the DPLL. Compared to the DPLL 100 of FIG. 1A, the first summer 102 of FIG. 1A is replaced with a summer 402 and the second summer 106 of FIG. 1A is not included. In both FIG. 1A and FIG. 4, a phase adjustment signal can be applied in a signal path between an output of the TDC of a DPLL and an input of a DCO of the DPLL. While FIGS. 1A and 4 illustrate two example DPLLs with phase adjustment, a phase adjustment can be applied at a different point in the DPLLs in these example DPLLs.

Similar to the DPLL 100 of FIG. 1A, the summer 402 and the accumulator 104 of FIG. 4 can operate as a phase detector. The summer 402 also enables phase adjustment. The summer 402 compares the difference of the frequency command word FCW with the output of the differencing block 114. The summer 402 also adds the phase adjustment signal Phase_offset so as to provide an adjusted frequency error $\Delta f_c$. Accordingly, the summer 402 can add the phase adjustment signal Phase_offset to the frequency command word FCW and subtract the output of the differencing block 114. The phase adjustment signal Phase_offset and the summer 402 can be arranged so as to perform any suitable operations (e.g., addition, subtraction, addition and subtraction, etc.) to cause the phase of the DPLL 400 to be adjusted. In FIG. 4, an adjusted frequency error $\Delta f_c$ provided by the summer 402 is a digital signal, which is integrated in the digital domain by the accumulator 104 so as to provide an adjusted DPLL phase error $\Phi_{ec}$.

By virtue of being injected at a different location, the phase adjustment signal Phase_offset used by the DPLL 400 can be different from the phase adjustment signal Phase_offset used by the DPLL 100. For instance, the phase adjustment signal Phase_offset used by the DPLL 400 can be nulled periodically instead of having a constant value. Further, it can have a value of 0 except for one clock cycle in some instances. For example, to make an adjustment of 10 degrees in the DPLL 100, the phase adjustment signal Phase_offset can be set to 10 degrees for all clock cycles. However, to make an adjustment of 10 degrees in the DPLL 400, the phase adjustment signal Phase_offset can be set to 10 degrees for only one clock cycle.

Figure 5:
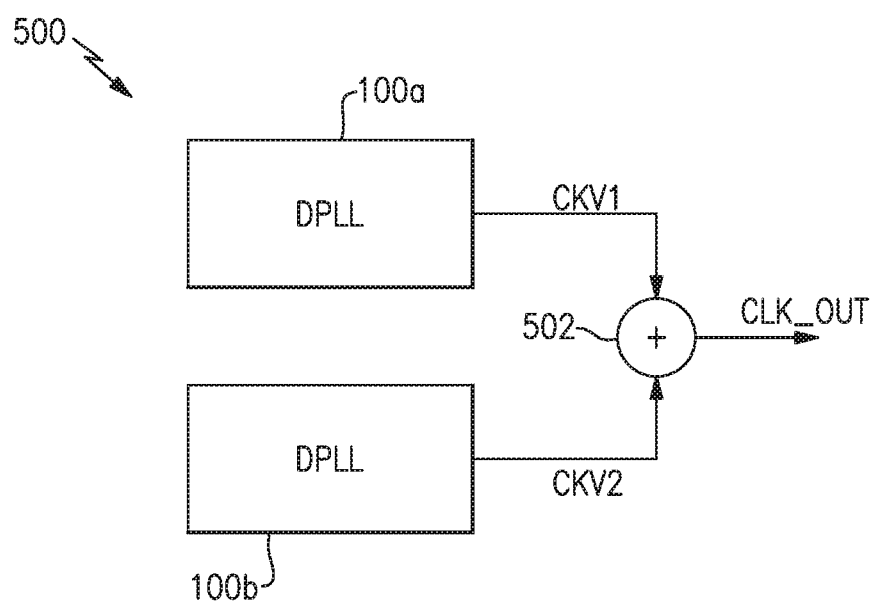
FIG. 5 is a schematic block diagram of a frequency synthesis system combining the output clocks of a first DPLL and a second DPLL according to an embodiment.

There are applications where it can be desirable to combine two or more clock signals from PLLs that are arranged to receive the same input signals. For instance, when two synchronized input clock signals having the same frequency are summed together, then the resulting sum can have a signal to noise ratio that is lower than either of the two input clock signals and/or have a higher output power than either of the individual clock signals. FIG. 5 illustrates a frequency synthesis system in which two clock signals are combined.

FIG. 5 is a schematic block diagram of a frequency synthesis system 500 arranged to combine output clock signals of a first DPLL 100a and a second DPLL 100b according to an embodiment. The first DPLL 100a and/or the second DPLL 100b can be implemented by the DPLL 100 of FIG. 1A and/or the DPLL 400. The first DPLL 100a and the second DPLL 100b can receive the same reference clock signal and generate output clock signals having the same frequency. The illustrated frequency synthesis system 500 also includes a combining circuit that combines output clock signals from the first DPLL 100a and the second DPLL 100b. As illustrated in FIG. 5, the combining circuit is a summer 502, which adds a first output clock signal CKV1 of the first DPLL 100a with a second output clock signal CKV2 of the second DPLL 100b to provide a combined output clock signal CLK_OUT. To improve the power content of the combined clock signal CLK_OUT, the output phase corresponding to output clock signal CKV1 and the output phase corresponding to output clock signal CKV2 can be synchronized for maximum power. The teachings herein can be used to adjust the output phases to achieve maximum power or alternatively to control the amount of power delivered by the combined clock signal CLK_OUT.

Although FIG. 5 shows the summer as combining only two output clock signals CKV1 and CKV2 from a first DPLL 100a and a second DPLL 100b, respectively, other configurations are possible. For instance, the output clocks from multiple DPLLs (more than two DPLLs) could be combined by the summer 502.

The DPLL 100 of FIG. 1A, the DPLL 180 of FIG. 1B, and/or the DPLL 400 of FIG. 4 can be used in a frequency synthesis system, such as the frequency synthesis system 500 of FIG. 5, to generate a combined output clock signal using two or more DPLLs. Synchronizing the output clock signals of multiple DPLLs using the same reference clock signal can be achieved by sending a re-synchronization pulse after a predetermined duration of time and resetting the output phase to a fixed value. The re-synchronization pulse can be controlled by the using the reference clock signal FREF of FIG. 1A, FIG. 1B, and FIG. 4. The output clock signals can be synchronized in phase such that the relative phase difference between their phases is reduced and/or eliminated. Such synchronization can involve adjusting the phases of the output clock signals to align to a reference clock signal FREF or adjusting the phase of one output clock signal to align it to the phase of another the output clock signal, for example.

The output clock signals can be synchronized in phase responsive to a re-synchronization signal. The re-synchronization signal can be asserted on some but not all of the cycles of the reference clock signal FREF. Accordingly, re-synchronization can be triggered on a subset of cycles of the reference clock signal FREF. Upon receiving the re-synchronization signal, the phase difference can be determined relative to a transition edge (either a high transition or a low transition) of the reference clock signal FREF. The phase difference between the multiple DPLL output clock signals can be measured and reset to the same value.

Synchronization can be relative to a reference clock signal FREF edge. The information included in the TDC/counter feedback path can advantageously be used to determine the phase difference between the reference clock signal FREF transition edge and the closest DPLL output clock signal edge CKV after the transition. For instance, the digital information in the TDC/counter path can be used to measure the phase difference between the reference clock signal FREF rising edge and the next closest DPLL output clock signal CKV rising edge during one or more reference clock signal cycles. The frequency system of FIG. 6 is an example system that can implement such features.

Figure 6:
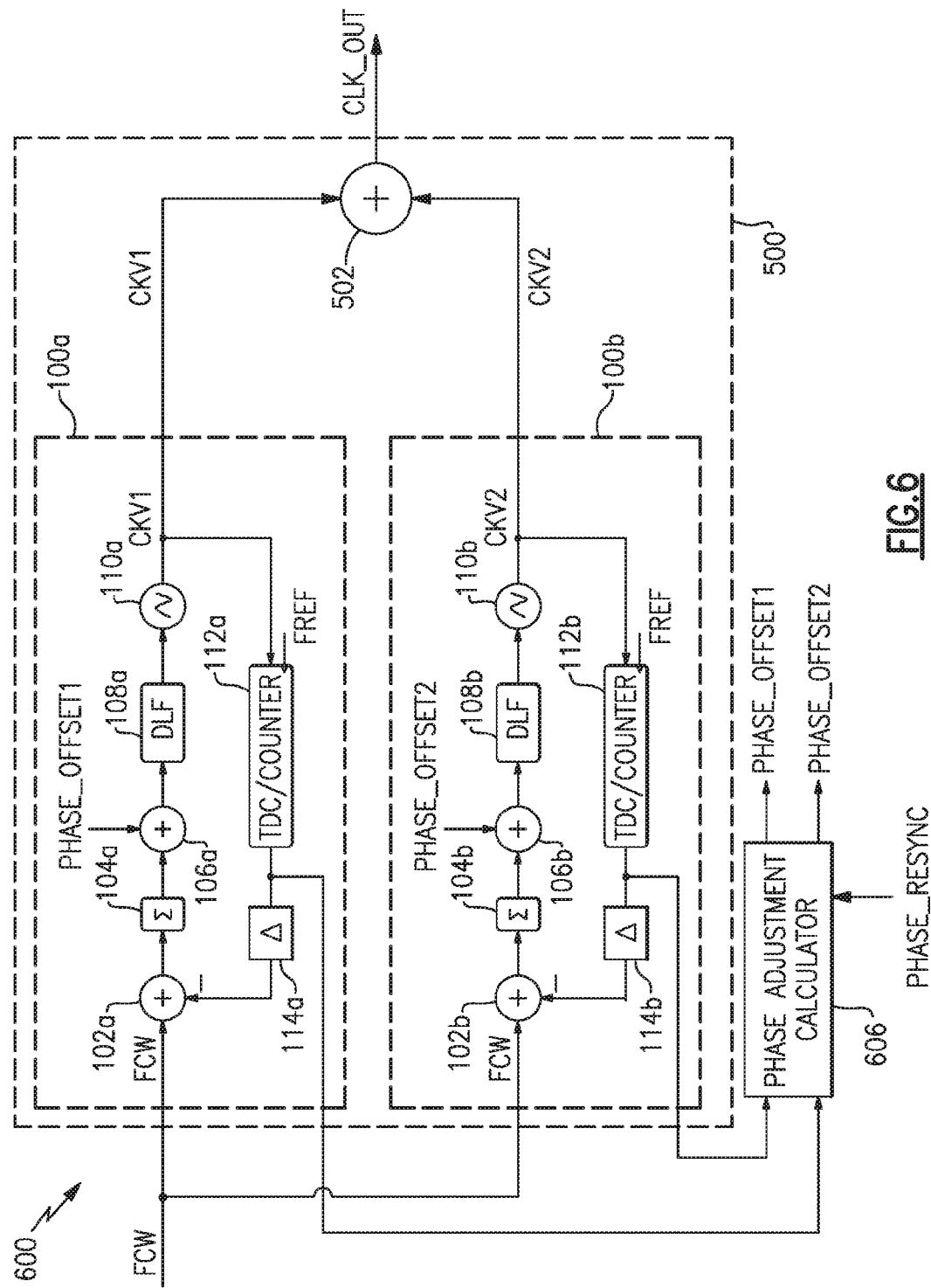
FIG. 6 is a schematic block diagram of a frequency synthesis system according to an embodiment.

FIG. 6 is a schematic block diagram of a frequency synthesis system 600 with phase adjustment according to an embodiment. The illustrated frequency synthesis system 600 includes an example of the frequency synthesis system 500 of FIG. 5 and a phase adjustment circuit 606. In the frequency synthesis system 600, the first DPLL 100a and the second DPLL 100b are each implemented by an instantiation of the DPLL 100 of FIG. 1A. In particular, the illustrated first DPLL 100a comprises a first summer 102a, an accumulator 104a, a second summer 106a, a DLF 108a, a DCO 110a, a TDC/counter 112a, and a differencing block 114a. Similarly, the illustrated second DPLL 100b comprises a first summer 102b, an accumulator 104b, a second summer 106b, a DLF 108b, a DCO 110b, a TDC/counter 112b, and a differencing block 114b also configured to operate similar to those of the DPLL 100 of FIG. 1A. Both the first DPLL 100a and the second DPLL 100b receive the same frequency command word FCW. The frequency command word FCW sets the target frequency of the output clock signals CKV1 and CKV2 of the first DPLL 100a and the second DPLL 100b, respectively.

As shown in FIG. 6, the output of the TDC/counter 112a and the output of the TDC/counter 112b can be used to measure a relative phase difference between the first DPLL 100a and the second DPLL 100b. The output of the TDC/counter 112a and the output of the TDC/counter 112b are provided to the phase adjustment circuit 606. The phase adjustment circuit 606 can calculate a relative phase difference between the output clock signals CKV1 and CKV2 based on the information associated with the TDC/counter 112a and the TDC/counter 112b. The phase adjustment circuit 606 can receive the reference clock signal FREF or any other suitable reference clock signal for determining the relative phase difference.

As shown in FIG. 6, the phase adjustment circuit 606 can receive a phase re-synchronziation signal Phase_resync. Responsive to the phase re-synchronization signal Phase_resync providing a re-synchronziation pulse to the phase adjustment circuit 606, the phase adjustment circuit 606 can generate the phase adjustment signals Phase_offset1 and Phase_offset2 from the relative phase difference. Then the phase adjustment signals can be used to reduce and/or eliminate the relative phase difference between the output clock signals CKV1 and CKV2 to thereby synchronize the phases of these signals.

Although FIG. 6 shows the phase re-synchronziation signal Phase_resync as being provided to the phase adjustment circuit 606, other configurations are possible. For instance, the phase re-synchonziation signal Phase_resync can be applied to other components such as the second summer 106a and the second summer 106b so as to cause synchronization of the phases of the DPLLs 100a and 100b.

Although FIG. 6 shows the frequency synthesis system 600 as using a configuration with a first DPLL 100a and a second DPLL 100b based on the DPLL 100 of FIG. 1A, other configurations are possible. For instance, the frequency synthesis system 600 could be configured to use more than two DPLLs. Further, the frequency synthesis system 600 could be modified to include DPLLs that are based on the DPLL 400 of FIG. 4 or the DPLL 180 of FIG. 1B. While FIG. 6 illustrates a frequency synthesis system 600 with each of the DPLLs arranged to receive a phase adjustment signal, in some other embodiments, one or less than all of the DPLLs can receive a phase adjustment signal to adjust the phase of its output clock signal. For instance, when there are two DPLLs with outputs being combined, the phase of the output clock signal of only one of the two DPLLs can be adjusted such that the phases of both output clock signals are synchronized.

Figure 7:
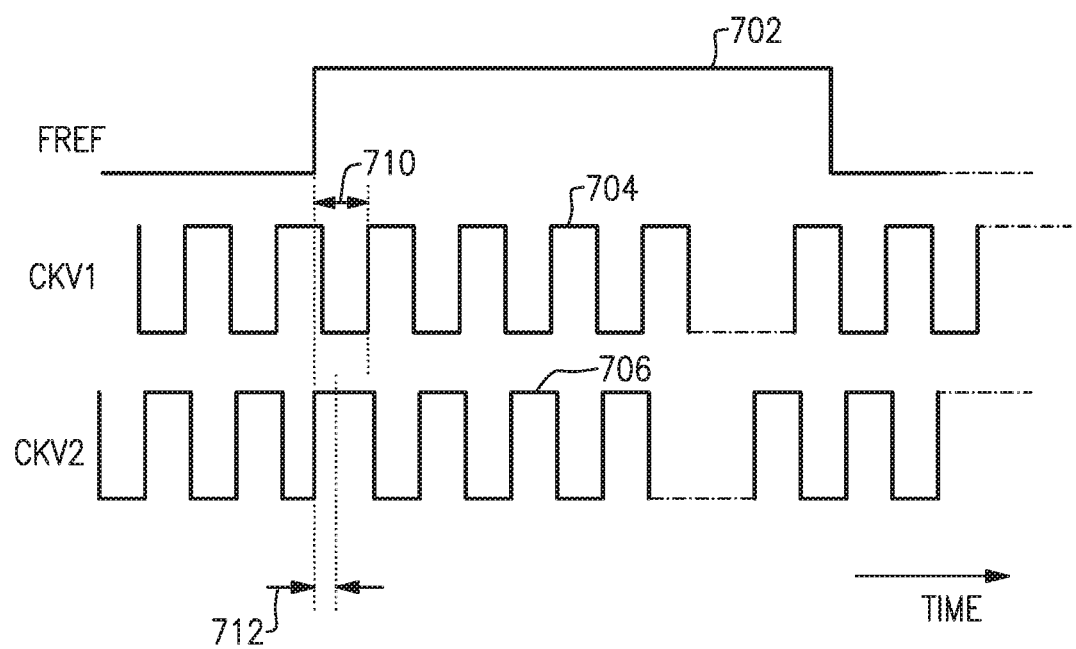
FIG. 7 is a graph that illustrates waveforms signals in the frequency synthesis system of FIG. 6 that can be used to determine a relative phase difference between output clock signals of different DPLLs.

FIG. 7 is a graph that illustrates the output phases of the output clock signals CKV1 and CKV2 and reference clock signal FREF in the frequency synthesis system 600 of FIG. 6. FIG. 7 shows a first waveform 702 of the reference clock signal FREF, a second waveform 704 of the first output clock signal CKV1, and a third waveform 706 of the second output clock signal CKV2. As described above, the first DPLL 100a and the second DPLL 100b receive the same frequency command word FCW, and the PLL locks to the target frequency. Once the PLLs are locked to the same frequency, a phase re-synchronization signal Phase_resync can provide a re-synchronization pulse to trigger the synchronization. While the phase re-synchronization signal Phase_resync is asserted, the first TDC/counter 112a and the second TDC/counter 112b provide information to the phase adjustment circuit 606, which can measure phase difference and effect adjustment to one or more of the phase adjustment signals Phase_offset1 and Phase_offset2.

As shown in FIG. 7, a first time interval 710 corresponds to an amount of from the transition edge of the reference clock signal FREF to the first rising edge of the first output clock signal CKV1. This time interval can represent the output phase corresponding to the first output clock signal CKV1. A second time interval 712 corresponds to an amount of time from the reference clock signal FREF transition edge to the first rising edge of the output clock signal CKV2. This time interval can represent the output phase of the second output clock signal CKV2. Using information indicative of these time intervals, from one or more outputs of the first TDC/counter 112a and/or the second TDC/counter 112b, the phase adjustment circuit 606 of FIG. 6 can adjust one of or both of the phase adjustment signals Phase_offset1 and Phase_offset2 so as to synchronize the output phases of the output clock signals CKV1 and CKV2. Hence, by sampling the information from the TDC/counters 112a and 112b following a reference clock signal FREF transition, the output clock signals CKV1 and CKV2 be synchronized.

Figure 8:
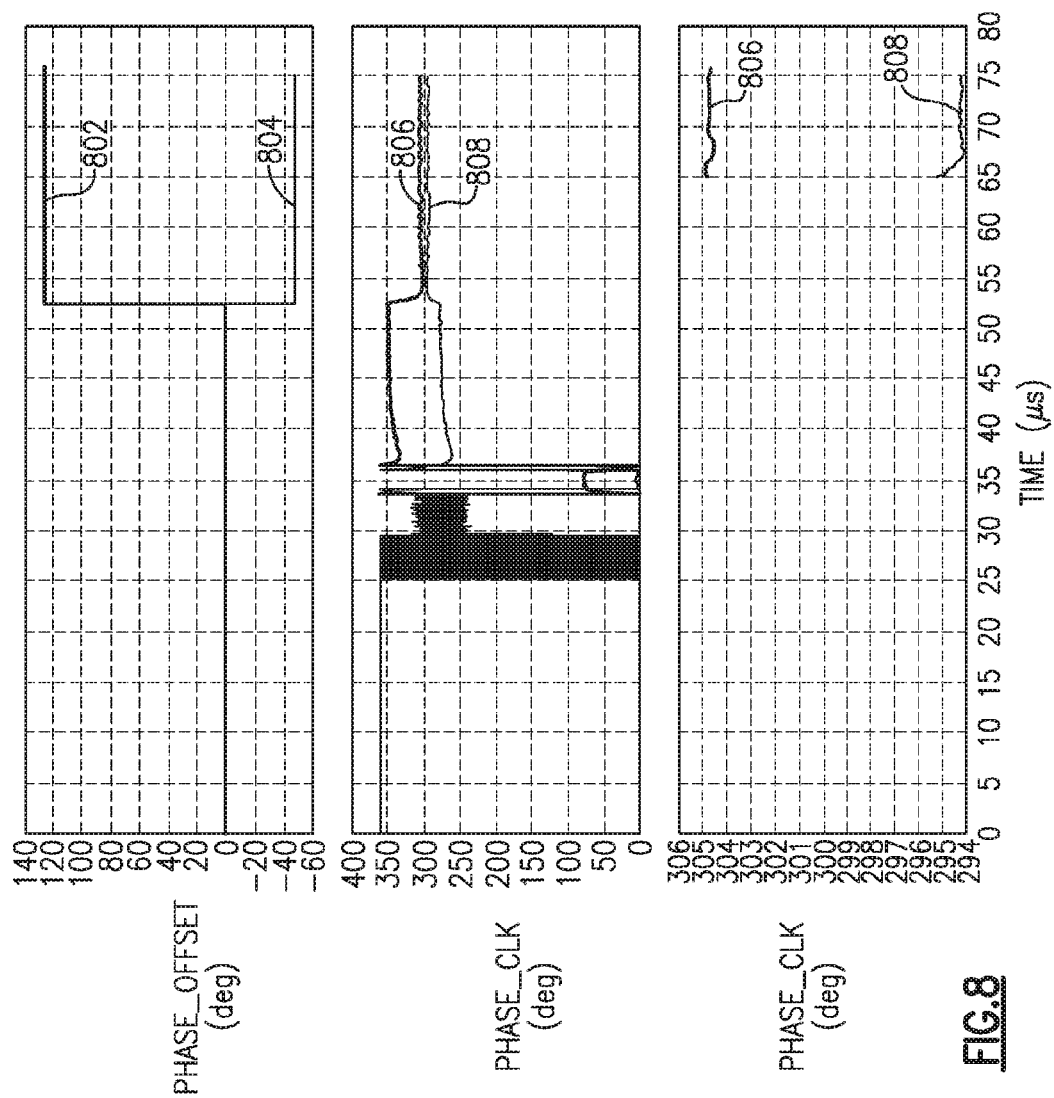
FIG. 8 shows simulated waveforms of phase synchronization in the system of FIG. 6.

FIG. 8 shows simulated waveforms of phase re-synchronization in the frequency synthesis system 600 of FIG. 6. A first graph shows a waveform 802 of the first phase adjustment signal Phase_offset1 and a waveform 804 of the second phase adjustment signal Phase_offset2 over time. The second graph shows a waveform 806 of the output phase of the first output clock signal CKV1 and a waveform 808 of the output phase of the second output clock signal CKV2. The third graph shows a magnified view of the waveforms 806 and 808.

Initially, in these simulations, the phase adjustment signals Phase_offset1 and Phase_offset2 are set to 0 and the first DPLL 100a and the second DPLL 100b acquire lock between times 0 and 45 us. Then at time equal to approximately 53 us, the phase re-synchronization signal Phase_resync is triggered. Upon acquiring lock at time equal to approximately 45 us before phase re-synchronization, the phase difference of the first output clock signal CKV1 and the second output clock signal CKV2 is about 70 degrees. After, the phase re-synchronization signal Phase_resync is triggered at time equal to approximately 53 us, the phase adjustment signals Phase_offset1 and Phase_offset2 are adjusted by the phase adjustment circuit 606. Thus, as seen from the waveforms 802 and 804, both phase adjustment signals Phase_offset1 and Phase_offset2 are changed to non-zero constant values. As seen from the waveforms 806 and 808 in the second and third graphs, the phase difference between the first output clock signal CKV1 and the second output clock signal CKV2 is reduced to about 10 degrees.

Further reduction in the phase difference can be obtained by increasing measurement accuracy within a frequency synthesis system. For instance, the accuracy of measuring phase difference between output clock signals in the frequency synthesis system 600 can be bounded by the accuracy of the TDC/counters 112a and 112b in estimating phase error. To improve accuracy, the resolution of the TDC/counters 112a and 112b can be increased. Another approach to improving accuracy is use different circuit component(s) to measure relative phase difference. For instance, an additional accumulator can be implemented with each of the first DPLL 100a and the second 100b to calculate a more accurate value of output phase compared to the measurements associated with FIG. 8.

Figure 9:
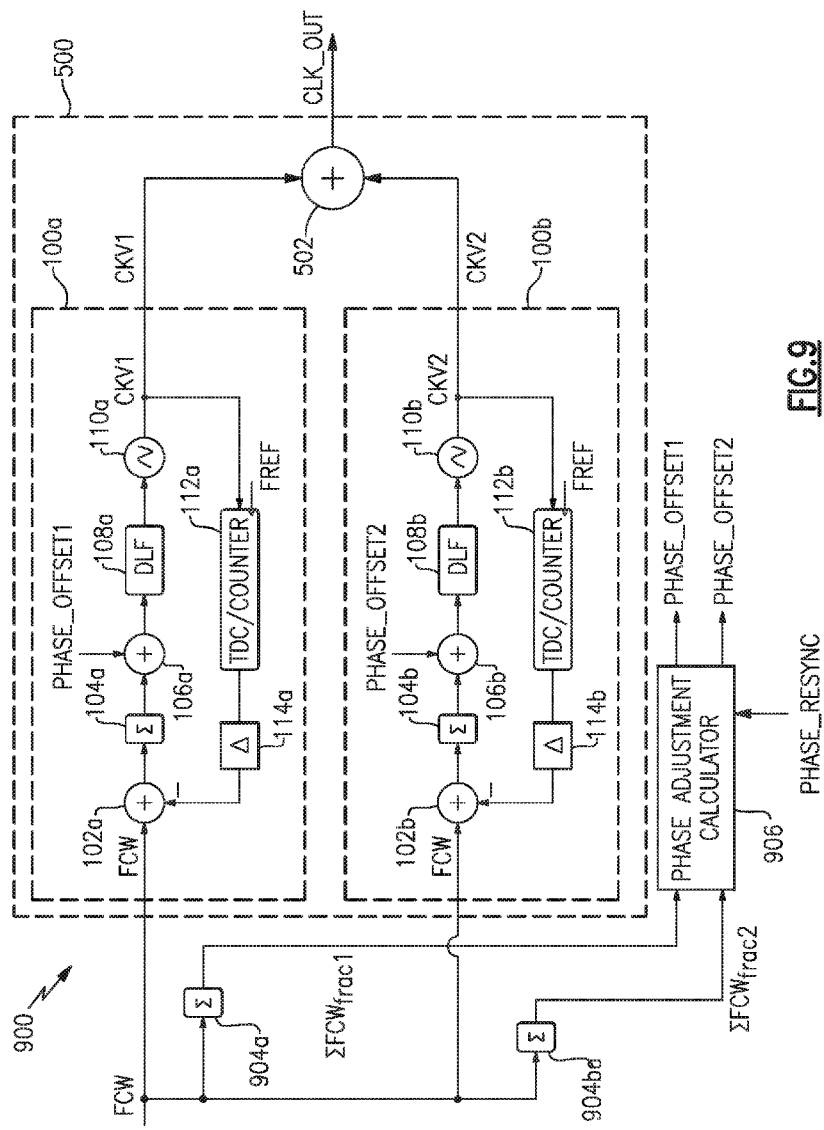
FIG. 9 is a schematic block diagram of a frequency synthesis system according to another embodiment.

FIG. 9 is a schematic block diagram of a frequency synthesis system 900 according to another embodiment. The frequency synthesis system 900 is similar to the frequency synthesis system 600 of FIG. 6 except the frequency synthesis system 900 is arranged to generate phase adjustment signals Phase_offset1 and Phase_offset2 differently. As illustrated, the frequency synthesis system 900 includes a first auxiliary accumulator 904a, a second auxiliary accumulator 904b, and a phase adjustment circuit 906. The first auxiliary accumulator 904a and the second auxiliary accumulator 904b can both accumulate the fractional part of the frequency command word FCW, but can receive different timing signals and/or be reset at different times. For instance, the first auxiliary accumulator 904a can be used to integrate the fractional part of the frequency command word FCW using the same timing signals and reset signals as used by the accumulator 104a. Similarly, the second auxiliary accumulator 904b can be used to integrate the fractional part of the frequency command word FCW using the same timing signals and reset signals used by the accumulator 104b. Due to process variations and/or other mismatches, the accumulators 104a and 104b can receive different reset and/or timing signals at different times. The reset and timing signals can depend on how and/or when the DPLLs are issued an acquisition command. The DPLL 100a and the second DPLL 100b can start acquisition at different times. For instance, the first DPLL 100a can be powered up and locked to a target frequency of the first clock signal and, subsequently, a synchronized second clock signal with the same frequency as the first clock signal can be provided by the second DPLL 100b. In this case, the timing and reset signals to the accumulators 104a and 104b should be different.

Using the same timing signals and reset signals as used by the accumulator 104a and 104b, the auxiliary accumulators 904a and 904b can provide accumulated values that include information about the output phases of the first DPLL 100a and the second DPLL 100b. For instance, after the phase re-synchronization signal Phase_resync triggers a re-synchronization transition, the first auxiliary accumulator 904a can provide a first accumulated value $\Sigma FCW_{frac1}$ that includes information about the output phase of the first output clock signal CKV1 while the first DPLL 100a is locked. Similarly, the second auxiliary accumulator 904b can provide a second accumulated value $\Sigma FCW_{frac2}$ that includes information about the output phase of the second output clock signal CKV2. The first accumulated value $\Sigma FCW_{frac1}$ and the second accumulated value $\Sigma FCW_{frac2}$ can be provided to the phase adjustment circuit 906 to determine the phase error and make adjustments to the phase adjustment signals Phase_offset1 and Phase_offset2.

Although FIG. 9 shows the frequency synthesis system 900 as using a configuration with a first DPLL 100a and a second DPLL 100b based on the DPLL 100 of FIG. 1A, other configurations are possible. For instance, a similar frequency synthesis system can include more than two DPLLs in parallel with each other. Alternatively or additionally, a frequency synthesis system configured to determine a relative phase difference using accumulated values of the frequency command word can include DPLLs that are based on the DPLL 400 of FIG. 4 and/or the DPLL 180 of FIG. 1B. When two DPLLs in accordance with FIG. 1B are implemented, outputs of the accumulator 104 of each DPLL can be used to determine the relative phase difference. Accordingly, accumulators of phase error detectors can be used to determine the relative phase difference between the DPLLs instead of implementing additional accumulators, such as the first auxiliary accumulator 904a the second auxiliary accumulator 904b.

While FIG. 9 illustrates a frequency synthesis system 900 with each of the DPLLs arranged to receive a phase adjustment signal, in some other embodiments, one or less than all of the DPLLs can receive a phase adjustment signal to adjust the phase of its output clock signal. For instance, when there are two DPLLs with outputs being combined, the phase of the output clock signal of only one of the two DPLLs can be adjusted such that the phases of both output clock signals are synchronized.

Figure 10:
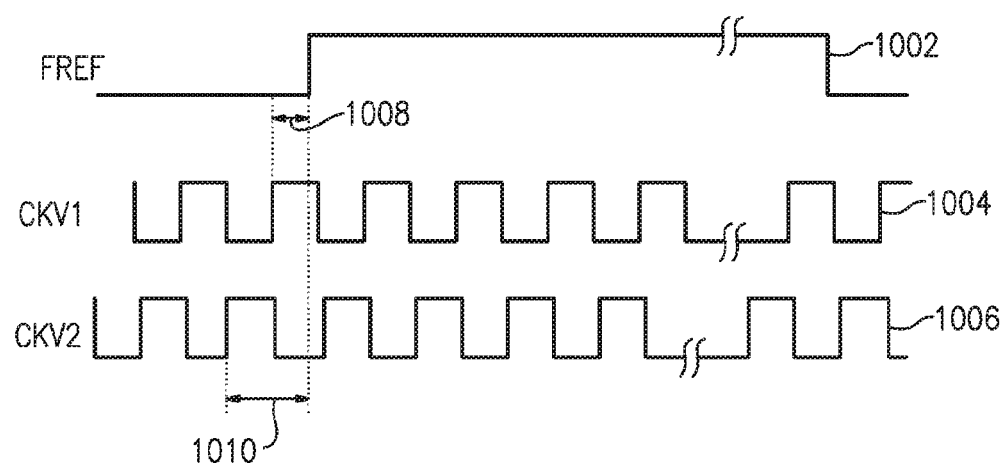
FIG. 10 is a graph that illustrates waveforms of signal in the frequency synthesis system of FIG. 9 that can be used to determine a relative phase difference between the output clock signals of DPLLs.

FIG. 10 illustrates the output phase and the phase offset following a re-synchronization transition in the frequency synthesis system 900 of FIG. 9. FIG. 10 shows a waveform 1002 of the reference clock signal FREF, a waveform 1004 of the first output clock signal CKV1, and a waveform 1006 of the second output clock signal CKV2. As described above, the first DPLL 100a and the second DPLL 100b can use the same reference clock signal FREF. After the phase re-synchronization signal Phase_resync triggers a re-synchronization transition, the reference clock signal FREF can be used to reset the TDC/counters 112a and 112b and the auxiliary accumulators 904a and 904b. After re-synchronization, the auxiliary accumulators 904a and 904b provide information used by the phase adjustment circuit 906 to measure the phase difference and effect adjustments to the phase adjustment signals Phase_offset1 and Phase_offset2.

As also shown in FIG. 10, a first time interval 1008 is the time interval from the reference clock signal FREF transition edge to the first preceding rising edge of the first output clock signal CKV1. This time interval can also represent the output phase of the first output clock signal CKV1. The value of the first time interval 1008 can be determined from the first accumulated value $\Sigma FCW_{frac1}$. Similarly, a second time interval 1010 is the time interval from the reference clock signal FREF transition edge to the first preceding rising edge of the second output clock signal CKV2. This time interval can represent the output phase of the second output clock signal CKV2. This information can be determined from the second accumulated value $\Sigma FCW_{frac2}$.

Figure 11:
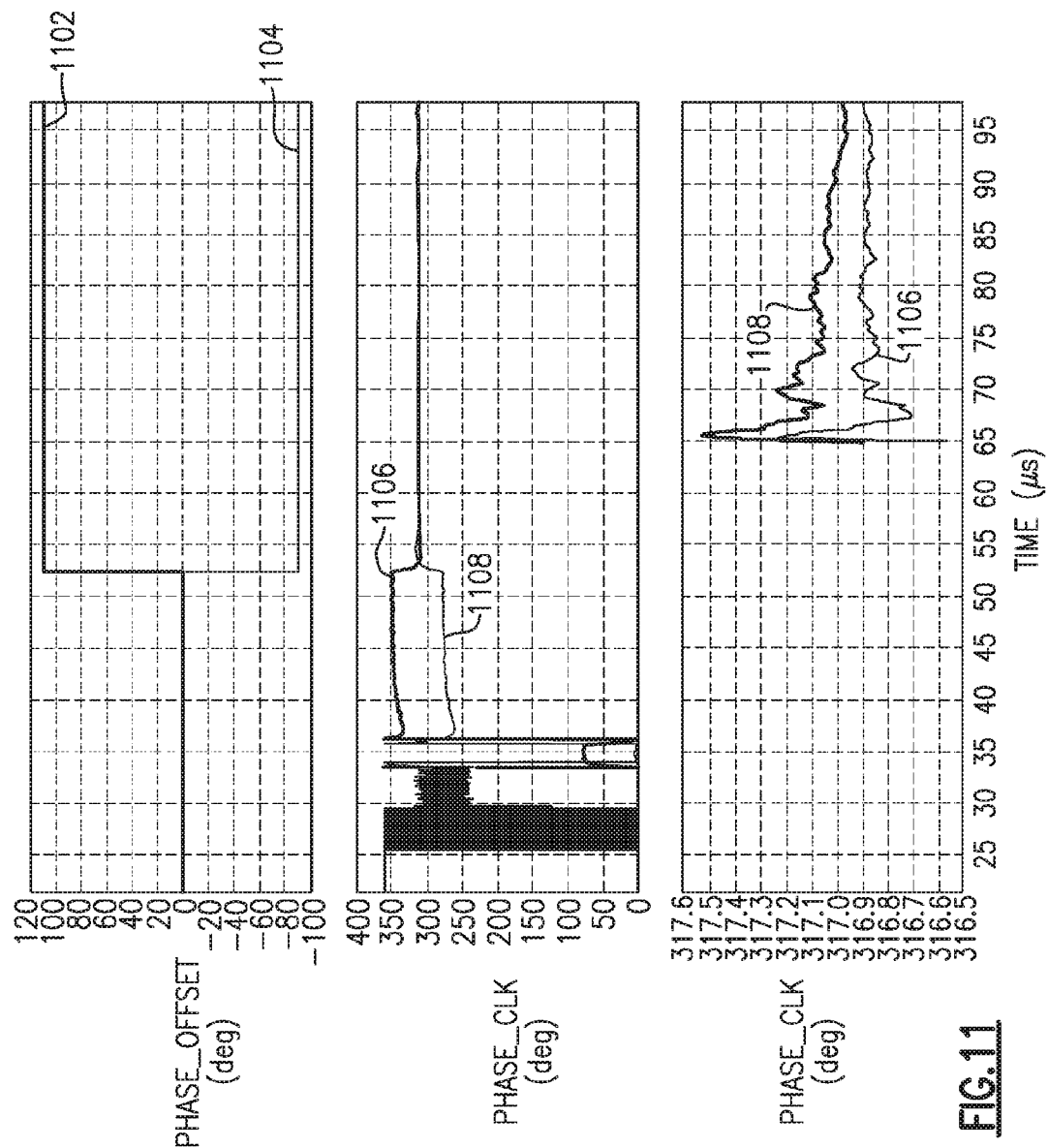
FIG. 11 shows simulated waveforms of phase synchronization in the system of FIG. 9.

FIG. 11 shows simulated waveforms of phase re-synchronization in the frequency synthesis system 900 of FIG. 9. The first graph shows a waveform 1102 of the first phase adjustment signal Phase_offset1 and a waveform 1104 of the second phase adjustment signal Phase_offset2 over time. The second graph shows a waveform 1106 of the output phase of the first output clock signal CKV1 and a waveform 1108 of the output phase of the second output clock signal CKV2. The third graph shows a magnified view of the waveforms 1106 and 1108.

Initially, the phase adjustment signals Phase_offset1 and Phase_offset2 are set to 0 and the first DPLL 100a and the second DPLL 100b acquire lock between times 0 and 45 us. Then at time equal to approximately 53 us, the phase re-synchronization signal Phase_resync triggers a re-synchronization transition. Upon acquiring lock at time equal to approximately 45 us before re-synchronization, the relative phase difference between the first output clock signal CKV1 and the second output clock signal CKV2 is about 70 degrees. After the phase resync signal Phase_resync is triggered at time equal to approximately 53 us, the correction terms for the first DPLL 100a and the second DPLL 100b are generated by the phase adjustment circuit 906. Thus, as seen from the waveforms 1102 and 1104, the phase adjustment signals Phase_offset1 and Phase_offset2 can be changed to non-zero constant values. Also, as shown by the waveforms 1106 and 1108 in the second and third graphs, the relative phase difference between the first output clock signal CKV1 and the second output clock signal CKV2 is reduced to about 0.3 degrees. Thus, using the accumulated values $\Sigma FCW_{frac1}$ and $\Sigma FCW_{frac2}$ to estimate output phase can advantageously increase the accuracy compared to the simulations associated with FIG. 8.

Any of the principles and advantages discussed herein can be applied to other systems, not just to the systems described above. Some embodiments can include a subset of features and/or advantages set forth herein. The elements and operations of the various embodiments described above can be combined to provide further embodiments. The acts of the methods discussed herein can be performed in any order as appropriate. Moreover, the acts of the methods discussed herein can be performed serially or in parallel, as appropriate. While circuits are illustrated in particular arrangements, other equivalent arrangements are possible.

Any of the principles and advantages discussed herein can be implemented in connection with any other systems, apparatus, or methods that benefit could from any of the teachings herein. For instance, any of the principles and advantages discussed herein can be implemented in connection with any devices with a need for adjust the output phase of a DPLL and/or synchronizing phases of two or more DPLLs with each other.

Aspects of this disclosure can be implemented in various electronic devices. For instance, one or more of the above DPLLs implemented in accordance with any of the principles and advantages discussed herein can be included in various electronic devices. Examples of the electronic devices can include, but are not limited to, radar systems, radar detectors, consumer electronic products, parts of the consumer electronic products such as semiconductor die and/or packaged modules, electronic test equipment, etc. Examples of the electronic devices can also include communication networks. The consumer electronic products can include, but are not limited to, a phone such as a smart phone, a laptop computer, a tablet computer, a wearable computing device such as a smart watch or an ear piece, an automobile, a camcorder, a camera, a digital camera, a portable memory chip, a washer, a dryer, a washer/dryer, a copier, a facsimile machine, a scanner, a multifunctional peripheral device, etc. Further, the electronic device can include unfinished products, including those for industrial and/or medical applications.

Unless the context clearly requires otherwise, throughout the description and the claims, the words "comprise," "comprising," "include," "including," and the like are to be construed in an inclusive sense, as opposed to an exclusive or exhaustive sense; that is to say, in the sense of "including, but not limited to." The words "coupled" or "connected", as generally used herein, refer to two or more elements that may be either directly connected, or connected by way of one or more intermediate elements. Thus, although the various schematics shown in the figures depict example arrangements of elements and components, additional intervening elements, devices, features, or components may be present in an actual embodiment (assuming that the functionality of the depicted circuits is not adversely affected). Additionally, the words "herein," "above," "below," and words of similar import, when used in this application, shall refer to this application as a whole and not to any particular portions of this application. Where the context permits, words in the Detailed Description of Certain Embodiments using the singular or plural number may also include the plural or singular number, respectively. The words "or" in reference to a list of two or more items, is intended to cover all of the following interpretations of the word: any of the items in the list, all of the items in the list, and any combination of the items in the list. All numerical values or distances provided herein are intended to include similar values within a measurement error.

While certain embodiments have been described, these embodiments have been presented by way of example only, and are not intended to limit the scope of the disclosure. Indeed, the novel apparatus, systems, and methods described herein may be embodied in a variety of other forms. Furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A frequency synthesis system comprising:
    a first digital phase-locked loop configured to output a first clock signal;
    a second digital phase-locked loop configured to output a second clock signal having substantially the same frequency as the first clock signal; and
    a phase adjustment circuit configured to measure a relative phase difference between the first clock signal and the second clock signal and output an indication of the relative phase difference,
    wherein the second digital phase-locked loop is configured to adjust a phase of the second clock signal based on the indication of the relative phase difference to cause the relative phase difference to be reduced.

2. The frequency synthesis system of claim 1, further comprising a combining circuit configured to generate an output clock signal based on the first clock signal and the second clock signal.

3. The frequency synthesis system of claim 1, wherein the second digital phase-locked loop comprises a digitally controlled oscillator and a time-to-digital converter, wherein phase adjustment signal is applied in a signal path from an output of the time-to-digital converter to an input to the digitally controlled oscillator.

4. The frequency synthesis system of claim 1, wherein the second digital phase-locked loop comprises a digital loop filter configured to receive a signal that is based on an output of a phase detector of the second digital phase-locked loop and the indication of the relative phase difference.

5. The frequency synthesis system of claim 1, wherein the phase adjustment circuit is configured to measure the relative phase difference between the first clock signal and the second clock signal based on a first signal from a feedback path of the first digital phase-locked loop and a second signal from a feedback path of the second digital phase-locked loop.

6. The frequency synthesis system of claim 1, wherein the phase adjustment circuit is configured to measure the relative phase difference between the first clock signal and the second clock signal based on an output of a first accumulator associated with the first digital phase-locked loop and an output of a second accumulator associated with the second digital phase-locked loop, the first accumulator and the second accumulator configured to reset at different times.

7. The frequency synthesis system of claim 1, wherein the first digital phase-locked loop is configured to adjust a phase of the first clock signal based on the indication of the relative phase difference.

8. The frequency synthesis system of claim 1, wherein the first clock signal and the second clock signal have phases that are within 1° of each other.

9. A phase-locked loop comprising:
    a digitally controlled oscillator configured to generate a clock signal; and
    a time-to-digital converter configured to provide an output signal,
    wherein the phase-locked loop is configured to receive a phase adjustment signal in a signal path from an output of the time-to-digital converter to an input to the digitally controlled oscillator, and wherein a phase of the clock signal is based on the phase adjustment signal and the output signal of the time-to-digital converter.

10. The phase-locked loop of claim 9, further comprising a digital loop filter coupled in the signal path from the output of the time-to-digital converter to the input to the digitally controlled oscillator, the digital loop filter being configured to receive a signal that is based on an output of a phase detector of the phase-locked loop and the phase adjustment signal.

11. The phase-locked loop of claim 9, further comprising a phase detector, a summer configured to receive an output of the phase detector and the phase adjustment signal, and a digital loop filter configured to receive an output of the summer.

12. The phase-locked loop of claim 9, further comprising a summer configured to receive a frequency command word and the phase adjustment signal and an accumulator configured to receive an output of the summer.

13. The phase-locked loop of claim 9, wherein the phase is adjustable over a range of 360°.

14. The phase-locked loop of claim 9, wherein the phase adjustment signal is a digital word.

15. A method of synchronizing phases of clock signals provided by digital phase-locked loops, the method comprising:
   detecting a relative phase difference between a first clock signal provided by a first digital phase-locked loop and a second clock signal provided by a second digital phase-locked loop, the first clock signal and the second clock signal having substantially the same frequency;
   providing an indication of the relative phase difference between the first clock signal and the second clock signal to the first digital phase-locked loop; and
   adjusting a phase of the first clock signal based on the indication of the relative phase difference between the first clock signal and the second clock signal to cause the relative phase difference to be reduced.

16. The method of claim 15, wherein said adjusting comprises applying a phase adjustment signal to a signal path between an output of a time-to-digital converter and an input of a digitally controller oscillator in the first digital phase-locked loop.

17. The method of claim 15, wherein said detecting comprises comparing an output of a first accumulator associated with the first digital phase-locked loop with an output of a second accumulator associated with the second digital phase-locked loop, and wherein the first accumulator and the second accumulator are configured to reset at different times.

18. The method of claim 15, further comprising generating an output clock signal based on the first clock signal and the second clock signal.

19. The phase-locked loop of claim 9, wherein the phase-locked loop comprises a phase adjustment input configured to receive the phase adjustment signal from outside of a feedback path of the phase-locked loop.

20. The phase-locked loop of claim 9, further comprising a summer in the signal path, the summer being configured to receive the phase adjustment signal from outside of a feedback path of the phase-locked loop and to adjust the phase of the clock signal based on the phase adjustment signal.

21. The phase-locked loop of claim 9 further comprising a summer in the signal path from the output of the time-to-digital converter to the input to the digitally controlled oscillator, wherein the summer comprises three inputs and one of the three inputs is configured to receive the phase adjustment signal.

22. The frequency synthesis system of claim 1, wherein the second digital phase-locked loop is configured to adjust the phase of the second clock signal in response to a phase re-synchronization signal being asserted.

* * * * *